United States Patent [19]

Kucherov et al.

[11] Patent Number: 5,653,800
[45] Date of Patent: Aug. 5, 1997

[54] METHOD FOR PRODUCING N-TYPE SEMICONDUCTING DIAMOND

[75] Inventors: Yan R. Kucherov, Salt Lake City, Utah; R. Ya. Kucherov, Podlsk, Russian Federation; G. S. Karumidze; Shota Shalvovich Shavelashvili, both of Tbilisi, Russian Federation; Paul S. Evans, Farmington, Utah

[73] Assignee: Eneco, Inc., Salt Lake City, Utah

[21] Appl. No.: 511,017

[22] Filed: Aug. 3, 1995

[51] Int. Cl.$^6$ ............................................. C30B 25/02
[52] U.S. Cl. .................... 117/79; 117/84; 423/446; 427/255.6
[58] Field of Search .................... 117/79, 84, 88, 117/92, 104; 427/248.1, 255.6

[56] References Cited

U.S. PATENT DOCUMENTS

| | | | |
|---|---|---|---|
| 3,630,679 | 12/1971 | Angus | 23/209.1 |
| 5,001,452 | 3/1991 | Imai et al. | 338/13 |
| 5,051,785 | 9/1991 | Beetz, Jr. et al. | 357/4 |
| 5,099,296 | 3/1992 | Mort et al. | 357/22 |
| 5,147,687 | 9/1992 | Garg et al. | 427/249 |
| 5,186,973 | 2/1993 | Garg et al. | 427/590 |
| 5,202,571 | 4/1993 | Hirabayashi et al. | 257/10 |
| 5,210,431 | 5/1993 | Kimoto et al. | 257/77 |
| 5,254,862 | 10/1993 | Kalyankjumar et al. | 257/77 |
| 5,373,171 | 12/1994 | Imai et al. | 257/77 |

FOREIGN PATENT DOCUMENTS

| | | | |
|---|---|---|---|
| 4-348514 | 5/1991 | Japan | H01L 21/205 |

OTHER PUBLICATIONS

Austin, I.G., "Electrical and Optical Properties of a Semiconducting Diamond" *Proc. Phys. Soc. London* B69 (1956), pp. 329–338.

Bezrukov, G.N. et al., "Some Electrical and Optical Properties of Synthetic Semiconducting Diamonds Doped with Boron" *Soviet Physics—Semiconductors* vol. 4, No. 4, (Oct. 1970) pp. 587–590.

Collins, A.T. et al, "The Nature of the Acceptor Centre in Semiconducting Diamond" *J. Physics C: Solid St. Physics* vol. 4 (1971) pp. 1789–1800.

Geis, M.W. et al., "High–Temperature Point–Contact Transistors and Schottky Diodes Formed on Synthetic Boron–Doped Diamond" *IEEE Electron Device Letters* vol. EDL–8, No. 8 (Aug. 1987) pp. 341–343.

Gildenblat, G. et al., "High–Temperature Thin–Film Diamond Field–Effect Transistor Fabricated Using a Selective Growth Method" *IEEE Electron Device letters* vol. 12, No. 2 (Feb. 1991) pp. 37–39.

Hauser, J.J. et al., "Hopping Conductivity in Implanted Amorphous Diamond, or How to Ruin a Perfectly Good Diamond" *Solid State Communications* vol. 18 (1976) pp. 789–790.

Morhange, J. et al., "Study of Defects Introduced by Ion Implantation in Diamond" *Japanese Journal of Applied Physics* vol. 14, No. 4 (Apr. 1975) pp. 544–548.

Shiomi, H, et al., "Electrical Characteristics of Metal Contacts to Boron–Doped Diamond Epitaxial Film" *Japanese Journal of Applied Physics* vol. 28, No. 5, (May 1989) pp. 758–762.

Tsai, W. et al., "Diamond MESFET Using Ultrashallow RTP Boron Doping" *IEEE Electron Device Letters* vol. 12, No. 4 (Apr. 1991) pp. 157–159.

Vavilov, V.S. et al., "Implantation of Antimony Ions Into Diamond" *Soviet Physics—Semiconductors* vol. 6, No. 12, (Jun. 1973) pp. 1998–2002.

Vavilov, V.S. et al., "Conductivity of Diamond Doped by Implantation of Phosphorus Ions" *Sov. Phys. Semicond.* vol. 9, No. 8 pp. 962–964.

Vavilov, V.S. et al., "Electrical Properties of Diamond Doped by Implantation of Lithium Ions" *Sov. Phys. Semicond.* vol. 13, No. 6, pp. 635–638.

Vavilov, V.S. et al., "Ion Implantation Into Diamond" *Radiation Effects* vol. 37 (1978) pp. 229–236.

Vishnevskii, A.S. et al., "Electrical Conductivity of Synthetic Diamond Crystals" *Sov. Phys. Semicond.* vol. 11, No. 10 (Oct. 1977) pp. 1186–1187.

Vishnevskii, A.S. et al., "Electrical Conductivity of Heavily Doped P–Type Diamond" *Sov. Phys. Semicond.* vol. 15, No. 6 (Jun. 1981) pp. 659–661.

Wedepohl, P.T., "Electrical and Optical Properties of Type IIb Diamonds" *Proc. Phys. Soc.* 70B (1957) pp. 177–185.

Primary Examiner—R. Bruce Breneman
Assistant Examiner—FeLisa Garrett
Attorney, Agent, or Firm—Paul S. Evans

[57] ABSTRACT

A method of making n-type semiconducting diamond is disclosed, which is doped with boron-10 at the time of diamond formation and bombarded with neutrons for in-situ conversion of boron-10 to lithium-7, while filtering the neutrons from high energy components during irradiation.

19 Claims, No Drawings

METHOD FOR PRODUCING N-TYPE SEMICONDUCTING DIAMOND

BACKGROUND OF THE INVENTION

1. Field of the Invention

This invention relates to methods and apparatus for producing n-type semiconducting diamond, and more particularly to such methods which utilize a uniformly distributed concentration of doping lithium through neutron transmutation.

2. Background Art

The present invention was developed to fill a need for a semiconducting diamond material with n-type conductivity. Semiconducting diamond has numerous attributes which are attractive for high-frequency, high-power semiconductor applications. These properties include a high electrical field breakdown voltage, elevated temperature stability, high electron and hole mobilities, high thermal conductivity, and excellent resistance to radiation.

A number of techniques for making diamond have been developed, such as high pressure, high temperature synthesis, shockwave synthesis, and chemical vapor deposition (including direct-current plasma chemical vapor deposition, microwave plasma chemical vapor deposition, and heated filament-assisted chemical vapor deposition).

Semiconducting synthetic or natural diamonds are mostly prepared or found as p-type materials, with boron atoms being the most common impurity. M. W. Geiss, D. D. Rathman, D. J. Ehrlich, R. A. Murphy, W. T. Lindley, "High-Temperature Point-Contact Transistors and Schottky Diodes Formed on Synthetic Boron-Doped Diamond," *IEEE Electron Device Letters*, Vol. EDL-8, No. 8, (August 1987), pp. 341–343, discloses the formation of point-contact transistors on synthetic boron-doped diamond. The diamond used in formation of the point-contact transistor is a diamond single crystal produced using a high-temperature-high-pressure process. H. Shiomi, y. Nishibayashi, N. Fujimore, "Electrical Characteristics of Metal Contacts to Boron-Doped Diamond Epitaxial Films," *Japanese Journal of Applied Physics*, Vol. 28, No. 5, (May 1989), pp.758–762, teaches the production of a planar field effect transistor device based on a diamond film. The device disclosed comprises a single crystal diamond substrate on which a single crystal epitaxial layer of boron doped diamond is deposited, thereby producing a p-type semiconductor layer. Titanium (Ti) source and drain contacts, as well as an aluminum (Al) gate Schottky contact are deposited on the diamond film.

Type IIb diamonds are described, in A. S. Vishnevskil, A. G. Gontar, "Electrical Conductivity of Heavily Doped P-Type Diamond," *Soviet Physics-Semiconductor*, Vol. 15(6), (June 1981), pp. 659–661; A. S. Vishnevskil, A. G. Gontar, "Electrical Conductivity of Synthetic Diamond Crystals," *Soviet Physics-Semiconductor*, Vol. 11 (1), (October 1977), pp. 1186–1187; G. N. Bezrukov, L. S. Smirnov, "Some Electrical and Optical Properties of Synthetic Semiconducting Diamonds Doped With Boron," *Soviet Physics-Semiconductor*, Vol. 4(4), (October 1970), pp. 587–590; J. J. Hauser, J. R. Patel, "Hopping Conductivity in C-Implanted Amorphous Diamond, or How to Ruin a Perfectly Good Diamond," *Solid State Communications*, Vol. 18, (1976), pp. 789–790; I. G. Austin, R. Wolfe, "Electrical and Optical Properties of a Semiconducting Diamond," *Proc. Phys. Soc.*, (1956), pp. 329–338; P. T. Wedepohl, "Electrical and Optical Properties of Type IIb Diamonds," *Proc. Phys. Soc.*, Vol. LXX, No. 2B, (1957), pp. 177–185; A. T. Collins, A. W. S. Williams, "The Nature of the Acceptor Centre in Semiconducting Diamond," *J. Phys. C: Solid St. Phys.*, Vol. 4, (1971), pp. 1789–1800; and V. S. Vavilov, "Ion Implantation into Diamond," *Radiation Effects*, Vol. 37, (1978), pp. 229–236.

Impurities such as lithium which produce n-type diamond have been incorporated into previously formed diamond crystal lattices by ion implantation methods. See "Electrical Properties of Diamond Doped by Implantation of Lithium Ions," V. S. Vavilov, E. A. Konorova, E. B. Stepanova, and E. M. Trukhan, *Soviet Physics-Semiconductors*, Vol. 13(6), (1979), pp. 635–638. However, this method produces only thin layers of n-type diamond, the thickness of which is limited by the energy of accelerated ions that are not infinite. Moreover, the incorporation of n-type impurities into diamond crystal lattices by ion implantation causes a severely damaged surface layer due to graphitization of the diamond which cannot be removed by annealing. Doping with lithium by this method to concentrations higher than $10^{15}$ cm$^{-3}$ also leads to graphitization. The implanted crystal must then be heat treated to electronically activate the implanted impurity. The severely damaged layer resulting from ion implantation and the inhomogeneity and significant concentration gradients of the implanted ion across the implanted film thickness render the n-type diamond unsuitable for semiconductor applications.

Another method for producing n-type diamond involves the formation of p-type diamond thin film by adding a boron compound such as diborane to the raw material gas for microwave plasma chemical vapor deposition and then converting boron-10 to lithium-7 by neutron irradiation. However, the chemical vapor deposition method limits the depth of the semiconducting substrate to approximately 100 microns. Moreover, the material is unsuitable for semiconductor materials because of radioactive isotopes created during neutron irradiation.

Other attempts to make an n-type semiconducting diamond are described in V. S. Vavilov, E. A. Konorova, "Conductivity of Diamond Doped by Implantation of Phosphorus Ions," *Soviet Physics-Semiconductors*, Vol. 9(8), (1976), pp. 962–964; V. S. Vavilov, E. A. Konorova, "Implantation of Antimony Ions Into Diamond," *Soviet Physics-Semiconductors*, Vol. 6(12), (1972), pp. 1998–2002; Jean-Francois Morhange, "Study of Defects Introduced by Ion Implantation in Diamond," *Japanese Journal of Applied Physics*, Vol. 14(4), (1975), pp. 544–548; Tsai et al, "Diamond MESFET Using Ultrashallow RTP Boron Doping," *IEEE Electron Device Letters*, Vol. 12, No. 4, (April 1991), pp. 157–159 and Gildenblat, et al., "High-Temperature Thin-Film Diamond Field-Effect Transistor Fabricated Using a Selective Growth Method," *IEEE Electron Device Letters*, Vol. 12, No. 2, (Feb. 1991), pp. 37–39.

There remains a need to provide a more satisfactory solution for producing a diamond semiconductor material with n-type conductivity.

SUMMARY OF INVENTION

The present invention seeks to resolve a number of the problems which have been experienced in the background art, as identified above. More specifically, the method of this invention constitutes an important advance in the art of n-type semiconducting diamond, as evidenced by the following objects and advantages realized by the invention over the background art.

An object of the present invention is to obtain bulk n-type semiconducting diamond rather than an implanted thin layer.

A further object of the present invention is to obtain n-type semiconducting diamond having a uniformly distributed concentration of doping of lithium.

Additionally, it is an object of the present invention to avoid graphitization of the diamond surface.

A further object of the present invention is to provide for high-frequency, high-power semiconductor applications.

Yet another object of the present invention is to preclude the existence of radioactive elements with unacceptable half-lives.

Additional objects and advantages of the invention will be apparent from the description which follows, or may be learned by the practice of the invention.

Briefly summarized, the foregoing objects are achieved by a method which comprises mixing carbon black enriched with carbon-12 and a dopant comprising boron-10, irradiating the mixture with thermal neutrons sufficient to convert the boron-10 to lithium-7, filtering the neutrons from high energy components during irradiation, and reacting the mixture at a temperature and pressure sufficient to provide a semiconducting diamond comprising diamond carbon and lithium-7.

DESCRIPTION OF THE PREFERRED EMBODIMENT

The present invention is a method of obtaining semiconducting diamond by doping of lithium into diamond crystals and high temperature annealing. Diamond is obtained by mixing boron-10 isotope with carbon black. The mixture is then irradiated by thermal neutrons to more than 50% burn-out of the boron isotope before solid phase transmutation of graphite into diamond.

Obtaining synthetic diamond by mixing boron-10 with carbon black and irradiating with thermal neutrons after graphitization allows diamond crystals to be doped with lithium by nuclear transmutation of boron-10 with thermal neutrons according to the following reaction:

$$N_{Li} = N_{B-10} \cdot \sigma \cdot \Phi$$

where $N_{B-10}$ is the concentration of boron-10 atoms introduced to the carbon black, $\sigma$ is the adsorption cross-section of thermal neutrons by boron-10 (which is about 4000 barn), and $\Phi$ is the neutron flux. Lithium introduced into the diamond by artificial methods is a consequence of a small thermal diffusion coefficient of $10^{-15}$ cm$^2$/s at 1800° K.

Whereas lithium in diamond crystals is a donor and boron is an acceptor, the concentration of transmuted lithium must be higher than the boron concentration remaining after the nuclear transmutation. This condition defines the lower limit of boron-10 burn-out as 50%. The upper limit is due to the solvability of boron atoms in graphite, which is about 1%. Hence, lithium concentrations up to about $5 \times 10^{20}$ cm$^{-3}$ can possibly be obtained in graphite.

The method of producing diamond from solid state transformation of graphite produced from carbon black is well known. See, example, Field, J. E., *The Properties of Diamond*, (London, N.Y., San Francisco, Academic Press, 1979); Orlov, IU. L., *The Mineralogy of the Diamond*, (New York, John Wiley & Sons, 1977); and Davies, G., *Diamond*, (Bristol BS1 6NX, Adam Hilger Ltd., 1984), the contents of which are specifically incorporated herein by reference. A single crystal diamond may be formed by any of the conventional methods such as gas phase methods (e.g., the sublimation method, the heating filament chemical vapor deposition (CVD) method, the microwave plasma CVD method, magnetic field coupled microwave plasma CVD, DC plasma CVD, RF plasma CVD, combustion flame, the reaction deposition method and the MBE method) and liquid phase methods. Other diamond growth processes are disclosed in Angus U.S. Pat. No. 3,630,679, issued in December of 1971, the contents of which are specifically incorporated herein. The raw materials for carbon can be carbon black powder or hydrocarbon gas such as methane, ethane, ethylene or acetylene, organic liquid such as alcohol or acetone, or carbon monoxide gas, Which may be suitably added with hydrogen, oxygen and/or water.

Boron doping can be achieved by addition of a boron-containing compound to the raw material gas through centrifugal or diffusion methods or by ion implantation. The concentration of boron-10 is up to about $1.5 \times 10^{20}$ cm$^{-3}$ of the semiconducting diamond. The introduction of a gaseous precursor, such as diborane for boron doping, enables doping of the diamond during the CVD process.

The present invention coupled with the known technology of producing synthetic diamond or naturally occurring diamond provides a method for producing bulk semiconducting diamond by the procedure set forth herein. The present invention also includes producing diamond thin film layers on a substrate. High purity carbon black (about 99.99% or greater) is mixed with boron-10 isotope and then annealed at about 400° C. to 2050° C., preferably at 1000° C., for about 2 to 3 hours to obtain "blacked" graphite. This "blacked" graphite is irradiated by thermal neutrons with the required flux $\Phi$. In the case of 50% burnout (transmuting more than 50%), the required flux would be (0.3 to 1)·$10^{20}$ neutrons, which is taken from the Rutherford formula $$I = I_o \cdot \sigma \cdot n \cdot l$$

where I is the number of nuclear reactions ($2.5 \times 10^{20}$), $I_o$ is the number of incident particles, $\sigma$ is the nuclear cross-section ($4 \times 10^{-21}$ cm$^2$ or $4 \times 10^3$ barn), n is the concentration of nuclear targets ($5 \times 10^{20}$ cm$^{-3}$), and l is the path of incident particles (1 to 3 boundaries; can be much less). Full graphitization is then achieved on "blacked" graphite at a temperature of about 2700° C. to 3000° C., preferably at 2800° C., and a pressure of about 32 MPa to 36 MPa, preferably at 35 Mpa, for about 1 to 2 hours with lithium impurities up to recrystallized graphite formation. The given temperature and time of annealing is enough to anneal any defects formed during the neutron irradiation. See, Dienes, G. J., Vineyard, G. H., *Radiation Effects in Solids, Interscience Monographs in Physics and Astronomy, Vol. II*. (New York, Interscience Publishers, 1957); and Gray, W. J. and Throwe, P. A., *Annealing of Neutron Damage in Graphite Irradiated and Stored at Room Temperature*, PNL-2676, UC-25, Prepared for the U.S. Department of Energy under Contracts EY-76-C-06-1830 AND EY-76-C-02-2712, January (1979), the contents of which are specifically incorporated herein. Bulk lithium-doped semiconducting diamond is produced from the previously described half-product by the following reaction:

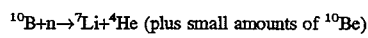
$^{10}B + n \rightarrow ^{7}Li + ^{4}He$ (plus small amounts of $^{10}Be$)

Because the nuclear interaction cross-section of boron-10 isotope is six orders of magnitude higher than that of a carbon, neutron flux attenuation in graphite depends on the distribution of boron-10 isotope concentration. This effect eliminates the non-uniformity of specific electric resistance of the ion implantation methods.

In addition to the main $^{10}B(n,\alpha)^{7}Li$ reaction, a whole spectrum of other reactions takes place during neutron irradiation, some of which are harmful to semiconductor properties. For example, the initial materials, carbon and boron, consist of two stable isotopes each: $^{12}C$, $^{13}C$, and $^{10}B$, $^{11}B$. The concentration of carbon-13 in natural carbon is 1.1%, and there is always a trace amount of boron-11 in boron regardless of the enrichment. The main reaction chains of carbon-12 are:

(1) $^{12}C(n,p)^{12}B$; ($\sigma = 0.28 \times 10^{-30}$ cm$^2$); $^{12}B(\tau=0.02\text{ s}) \rightarrow \beta^- \rightarrow ^{12}C$ where $\sigma$ is the reaction cross-section for uranium fission neutrons, $\tau$ is the half-life of $^{12}B$ isotope (this and other nuclear data taken from "Tables of Physical Values," I. Kicoin, *Moscow Energoatomizdat*, (1990)). It is evident that this reaction does not introduce any radioactive products into the semiconductor. Similarly, the following reactions do not introduce harmful products into the semiconductor, except for minor radiation damage, whereas the final products are stable with relatively short half-lives:

(2) $^{12}C(n,\alpha)^9Be$ (3) $^{12}C(n,2\text{ n})^{11}C$; $^{11}C(\tau=20.38\text{ min}) \rightarrow \beta^+ \rightarrow ^{11}B$ However, secondary reactions producing Be, which are the result of both $^{12}C$ and $^{10}B$ irradiation with neutrons and (4) $^{13}C$ (n,$\alpha$)$^{10}Be$, produce radioactive isotope $^{10}Be$ with a half-life of $2.7 \times 10^6$ years and beta particles with 550 KeV energy as radioactivity. With a fixed neutron flux, the ratio of $^{10}Be$ from reaction (4) to both $^{12}C$ (n,$\alpha$) and $^{10}B$ (n,p) is more than $10^6$ times.

The estimation for a 1 cm$^3$ diamond cube at a flux of $10^{20}$ neutrons in reaction (4) gives a radioactivity of $3 \times 10^6$ decays per second, which makes this material unsuitable for semiconductor applications. These estimations show that even with a 100 microns thick diamond substrate, the isotopic ratio of $^{12}C$ to $^{13}C$ must be better than $10^4:1$ in order to be consistent with natural radioactivity. Hence, the initial carbon must be $^{12}C$ enriched to better than about 99.99% to avoid the creation of radioactive Be during neutron irradiation. Centrifugal, diffusion, and electromagnetic enrichment methods may be used.

Because the nuclear cross-section for reaction (2) at a neutron energy of 10 MeV is about 100 times higher than for thermal neutrons, the neutron spectrum must be filtered from high energy components of thermal neutrons during irradiation to avoid $^{10}Be$ formation. Moreover, this method will bring down defect formation in the graphite. The filtering can be achieved by numerous known methods for absorbing or reflecting thermal neutrons. For example, thermal neutrons may be absorbed with a high temperature withstanding moderator such as a coated zirconium hydride having a thickness of 10 cm or greater, preferably between 10 and 20 cm. A high hydrogen concentration is preferred (up to ZiH$_2$). See, Egelstaff, P. A. and Poole, M. J., *Experimental Neutron Thermalisation*, (N.Y., Pergamon Press, 1969), pp. 233–269, the contents of which are specifically incorporated herein. A water bath with a high rate of water flow may also be used to absorb thermal neutrons. Another means includes a stainless steel container with zirconium hydride powder located inside the container and surrounding the sample. Neutron filters are described in Egelstaff, P. A., *Thermal Neutron Scattering*, (London, Academic Press, 1965), pp. 142–192, the contents of which are specifically incorporated herein. Furthermore, neutrons may be reflected by materials such as beryllium.

EXAMPLE I

High purity carbon black is mixed with 1 at. % of amorphous boron, enriched to 99.5% at. % of boron-10 isotope. The contents of the main substance is 99%, 0.5% of free carbon and less than 0.5% concentration of all other impurities. The particles size is 3–7 microns for carbon black and 0.5–1.0 microns for amorphous boron. The particles are mixed with an eddy mill for about two hours. "Blacked" graphite is obtained by annealing the mixture for about 150 minutes at a temperature of about 1000° C. The "blacked" graphite is then irradiated with a thermal neutron flux of $2.5 \times 10^{20}$ cm$^{-2}$. After about one month of post-irradiation time required by reactor irradiation safety regulations, re-crystallization of the already doped "blacked" graphite is undertaken at a pressure of 35 MPa and at a temperature of 2800° C. for about 90 minutes. The next stage is the solid phase transformation of this graphite into diamond at a pressure of 10,000 MPa for about 30 minutes. After annealing the diamond at a temperature of 1800° K. for about 60 minutes, the diamond doped with lithium to a concentration of $2 \times 10^{20}$ cm$^{-3}$ with electron conductivity and 5% non-uniformity of electric resistivity is obtained.

The given example having a carrier concentration of $2 \times 10^{20}$ cm$^{-3}$ shows that by using the method described herein, it is possible to produce bulk samples of diamond single crystals with electron conductivity. The non-uniformity of electrical resistance ($\approx 5\%$), shows a highly uniform distribution of lithium atoms in the crystalline lattice.

The present invention provides for bulk diamond crystals with electron conductivity for fabrication of semiconducting devices, temperature and radiation resistant thermoresistors, nuclear radiation detectors, Shottke diodes, light emitting diodes, electron emitting diodes, bipolar transistors, and various other sensors.

In summary, the method disclosed herein is a significant improvement from the present state of the art of n-type semiconducting diamond.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for producing semiconducting diamond, comprising the steps of:

mixing a gas comprising carbon enriched with carbon-12 and a dopant comprising boron-10;

forming diamond by reacting said mixture by a gas phase method;

irradiating said mixture with a neutron flux of at least about (0.3 to 1)$\times 10^{20}$ neutrons to convert the boron-10 to lithium-7;

filtering said neutrons from high energy components during irradiation; and reacting said mixture at temperature and pressure sufficient to provide a semiconducting diamond comprising diamond carbon and lithium-7.

2. A process according to claim 1, wherein said carbon-12 has an isotopic purity of at least about 99.99%.

3. A process according to claim 1, wherein the concentration of boron-10 is up to about $1.5\times10^{20}$ cm$^{-3}$ of said semiconducting diamond.

4. A process according to claim 1, wherein said dopant has a molar ratio of dopant atoms to carbon atoms being up to about 1.5%.

5. A process according to claim 1, wherein said gas comprises hydrocarbon gas such as methane, ethane, ethylene or acetylene; organic liquid such as alcohol or acetone; or carbon monoxide gas, which may be suitably added with hydrogen, oxygen and/or water.

6. A process according to claim 1, wherein said gas phase method comprises a heating filament CVD method.

7. A process according to claim 1, wherein said gas phase method comprises a microwave plasma CVD method.

8. A process according to claim 1, wherein said gas phase method comprises a DC plasma CVD method.

9. A process according to claim 1, wherein said gas phase method comprises a RF plasma CVD method.

10. A process according to claim 1, wherein said gas phase method comprises a reaction deposition method.

11. A process according to claim 1, wherein diamond to which boron has been added is formed as a film on a substrate using microwave plasma CVD, with a gas containing methane and diborane as raw material.

12. A process according to claim 1, wherein said neutrons are filtered by a neutron absorbing means.

13. A process according to claim 12, wherein said neutron absorbing means comprises a high temperature moderator.

14. A process according to claim 13, wherein said high temperature moderator comprises coated zirconium hydride.

15. A process according to claim 13, wherein said high temperature moderator comprises a water bath.

16. A process according to claim 13, wherein said high temperature moderator comprises a stainless steel container having zirconium hydride powder contained therein.

17. A process according to claim 1, wherein said neutrons are filtered by a neutron reflecting means.

18. A process according to claim 17, wherein said neutron reflecting means comprises beryllium.

19. A process according to claim 1, wherein said semiconducting diamond is an n-type semiconductor.

* * * * *